(12) United States Patent
Di Cioccio

(10) Patent No.: US 6,391,799 B1
(45) Date of Patent: May 21, 2002

(54) PROCESS FOR FABRICATING A STRUCTURE OF SEMICONDUCTOR-ON-INSULATOR TYPE IN PARTICULAR SICOI

(75) Inventor: Léa Di Cioccio, Saint-Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/582,630
(22) PCT Filed: Jan. 27, 1999
(86) PCT No.: PCT/FR99/00155
§ 371 Date: Jul. 26, 2000
§ 102(e) Date: Jul. 26, 2000
(87) PCT Pub. No.: WO99/39371
PCT Pub. Date: Aug. 5, 1999

(30) Foreign Application Priority Data

Jan. 28, 1998 (FR) .......................................... 98 00899

(51) Int. Cl.[7] .............................................. H01L 21/31
(52) U.S. Cl. ........................ 438/781; 438/458; 438/508; 438/445
(58) Field of Search ................................. 438/781, 780, 438/458, 483, 508, 507, 445, 660, 767, 763, 795, 796

(56) References Cited

U.S. PATENT DOCUMENTS 5,563,428 A * 10/1996 Guarin et al. .................. 257/77
5,759,908 A * 6/1998 Steckl et al.
6,013,563 A * 1/2000 Henley et al.
6,171,965 B1 * 1/2001 Kang et al.

FOREIGN PATENT DOCUMENTS

EP 0 533 551 3/1993

OTHER PUBLICATIONS

Tong, Q, et al. "A feasibility study of SiC on oxide by wafer bonding and layer transferring" Proc. Int. SOI Conf., Palm Springs, Oct. 1993 pp. 60–61.*
DiCioccio, L. et al. "Silicon carbide on insulator formation by the smart-cut process", Mat. Sci. & Eng. B vol. 46, No. 1–3, Apr. 1997 pp. 349–356.*
B. Dance, Semiconductor International: European Report, page 58, "Smart Cut Process Offers SiC Structures on Silicon Wafers," May 1997.

* cited by examiner

Primary Examiner—Caridad Everhart
(74) Attorney, Agent, or Firm—Oblon, Spivak, McClelland, Maier & Neustadt, P.C.

(57) ABSTRACT

A process for fabricating a structure including a carrier substrate and a layer of semiconductor material on one surface of the carrier substrate. The process a) forms a layer of semiconductor material on one surface of a first substrate, b) forms a cleavage zone in the first substrate, which delimits a superficial layer, c) transfers the first substrate, with the layer of semiconductor material, onto the carrier substrate, d) provides energy to cause cleavage of the first substrate along the cleavage zone, and e) removes said superficial layer to uncover the layer of semiconductor material.

13 Claims, 2 Drawing Sheets

PROCESS FOR FABRICATING A STRUCTURE OF SEMICONDUCTOR-ON-INSULATOR TYPE IN PARTICULAR SICOI

BACKGROUND OF THE INVENTION

1. Field of the Invention

This invention relates to a particular process for fabricating a structure comprising a carrier substrate and a layer of semiconductor material on one surface of the carrier substrate.

More particularly, it concerns the forming of a semiconductor-on-insulator structure such as, for example, a structure of silicon carbide-oxide-semiconductor type.

The invention finds applications in the areas of microelectronics and optoelectronics for the fabrication of substrates such as substrates comprising a GaN layer. This material is a semiconductor with a wide forbidden band and allows the fabrication of electro-optic devices such as electroluminescent diodes or lasers which operate in the ultraviolet and blue spectrum.

The invention also finds applications in the manufacture of microsystems able to operate in hostile environments, such as high temperature environments or corrosive atmospheres. In this case, with the process of the invention it is possible, for example, to provide thin membranes of silicon carbide able to withstand the stresses of the hostile environment.

2. Disscussion of the Background

As indicated previously, gallium nitride (GaN) is a material of particular interest on account of its wide forbidden band for the fabrication of electro-optical devices. For such applications, however, it proves to be impossible to obtain monocrystalline GaN blocks of sufficient size.

Therefore, at the present time, substrates are made which comprise one layer of GaN that subjected to heteroepitaxial growth on a sapphire or silicon carbide (SiC) substrate.

The use of sapphire as epitaxial substrate leads to obtaining GaN layers having a high density of crystalline defects. By using silicon carbide (SiC) as epitaxial substrate, it is possible to obtain better crystalline quality—since there is better mesh parameter agreement between GaN and SiC.

The very high cost of monocrystalline SiC substrates is, however, a handicap in its use for epitaxial growth.

On account of the high cost of monocrystalline SiC substrates, it is possible to have recourse to more economical substrates which only comprise a thin superficial layer of SiC on the surface of a basic substrate in silicon.

However, silicon, silicon carbide and the gallium nitride that is subsequently formed have fairly different thermal dilatation coefficients. Considerable stresses and a high defect density therefore occur during the formation of the gallium nitride on this type of substrate.

This problem may be at least partly solved by providing an oxide layer between the silicon and the silicon carbide. This layer brings a reduction in the stresses due to differential dilatation and leads to obtaining a so-called "compliant" substrate.

In known manner, it is for example possible to fabricate structures of silicon carbide-on-insulator type (SiCOI), by forming a layer of SiC through epitaxy on a substrate of silicon-on-insulator type (SOI).

In such cases, however, a thin film of silicon remains from the superficial silicon layer of the SOI, between the SiC and the oxide. This silicon film causes some loss of the "compliant" properties obtained with the oxide layer of the SOI structure. Also, during SiC epitaxy, cavities are formed in the oxide layer and defects occur in the SiC layer.

It is also possible to conduct carburization of the superficial silicon layer of a substrate of silicon-on-insulator (SOI) type, to convert it entirely into SiC and thereby obtain a SiC/Oxide interface with no intermediate silicon.

This solution, however, proves to be difficult to implement insofar as the superficial silicon layer of SOI structures generally has a thickness of a few hundred nanometres. The carburization of silicon only enables a SiC layer to be obtained over a thickness that is in the order of a few dozen nanometres.

Document (1), whose reference is specified at the end of this disclosure, puts forward another process for obtaining a "compliant" substrate comprising a silicon carbide layer on an oxide layer.

According to this document, an oxide layer is formed on the surface of a solid SiC substrate and ions are implanted in the substrate to create a weakened zone therein. This weakened zone delimits in the substrate a superficial layer of SiC in contact with the oxide layer.

The SiC substrate, provided with the oxide layer, is then transferred to a target substrate in silicon by contacting the oxide layer with the target substrate.

Finally heat treatment is applied to cause cleavage of the SiC substrate along the weakened zone and release the superficial SiC layer. This layer remains integral with the target substrate via the insulator layer.

The cleavage of a substrate along a weakened zone using heat treatment is also described in document (2) whose reference is also specified at the end of this disclosure.

The structure finally obtained therefore has, in the following order, a silicon substrate, an oxide layer then a silicon carbide layer.

With the process described above, it is possible to obtain carriers with a SiC layer which are less costly than substrates in monocrystalline SiC. The process does however have a certain number of limitations.

It appears that a relatively high heat schedule (treatment time-treatment temperature) is required for cleavage of the silicon carbide. This heat schedule is for example 1 hour at 850° C. By way of comparison, cleavage of silicon may be brought about with a schedule of only 30 seconds at 500° C.

Also, the cleaved silicon carbide proves to have surface roughness. The SiC surface therefore has to be treated by polishing before other semiconductor materials, such as GaN, can be formed on this surface.

SUMMARY OF THE INVENTION

The purpose of the invention is to put forward a process for fabricating a structure comprising a carrier substrate and a layer of semiconductor material on one surface of this substrate, such as a structure of silicon-on-insulator type, and in particular silicon carbide on insulator, which does not encounter the difficulties or limitations set forth above.

One purpose in particular is to put forward an economical process for fabricating a structure of silicon carbide-oxide-silicon type which does not require a high heat schedule during the cleavage operation.

Another purpose is to propose such a process with which it is possible to obtain a SiC layer having excellent surface condition.

A further purpose is also to put forward a process for fabricating carriers for a GaN layer.

Yet a further purpose is to enable a large-size structure to be obtained (in particular with SiC or GaN layers).

To achieve these purposes, the invention sets out more specifically to propose a process for fabricating a structure comprising a carrier substrate and a layer of semiconductor material on one surface of the carrier substrate, the process comprising the following successive steps:

a) forming a layer of semiconductor material on one surface of a first substrate, b) implanting ions in the first substrate, underneath said surface, in the vicinity of the layer of semiconductor material, to form a zone, called a cleavage zone, which delimits a superficial layer in the first substrate, in contact with the layer of semiconductor material, c) transferring the first substrate, with the layer of semiconductor material, onto the carrier substrate, the layer of semiconductor material being made integral with the carrier substrate, d) providing energy to cause cleavage of the first substrate along the cleavage zone, the superficial layer of the first substrate remaining integral with the layer of semiconductor material and with the carrier substrate during cleavage, e) removing said superficial layer to uncover the layer of semiconductor material.

According to one advantageous embodiment, the supply of energy for step d) is chosen from among a supply of thermal energy, mechanical energy, or a combination of these energies.

By supply of thermal energy is meant the application of heat treatment.

This heat treatment may be applied using a heat schedule that is determined in relation to the different heat schedules used throughout the process. In particular, this heat treatment may take into account overheating induced by heat treatments of off-thermodynamic equilibrium type such as those which may result from the ion implantation step, and by heat treatments using substrate heating or cooling such as for implantation for example, or possible reinforcement of bonding forces when bonding to a support.

This heat treatment may also give consideration to the use of other supplies of energy such as the application of mechanical forces.

Hence, at step d), the heat treatment may be zero, the supply of energy in this case possibly only being in mechanical form.

According to one advantageous embodiment of the invention, removal step e) is conducted using a removal process chosen from among wet or dry chemical etching, polishing, oxidation followed by etching, or a combination of these modes.

According to one particular aspect of the invention, between steps a) and b), or between steps b) and c), the layer of semiconductor material may be subjected to treatments such as in particular treatments to fabricate active and/or passive components. If components are fabricated before step b), these treatments are then taken into account to determine the conditions of ion implantation.

According to one particular embodiment of the invention, the first substrate may be a silicon substrate, and the layer of semiconductor material may be a layer of silicon carbide.

It is seen that, in this case, the cleavage made at step d) of the process does not occur in a layer of silicon carbide, but in the silicon of the first substrate. Cleavage may then be caused with a lower heat schedule which, moreover, leaves intact the layer of silicon carbide.

In addition, the process of the invention is adapted to the fabrication of structures with a layer of semiconductor material, SiC in particular, which have a very large surface area.

During step c) of the process, the layer of semiconductor material may be made integral with the substrate by means of heat treatment.

The same heat treatment may be extended and made use of to cause the cleavage in step d) of the process.

In order to obtain a final structure with good "compliant" properties, for which the differences in thermal dilatation coefficients only have little effect, an oxide layer may be provided between the layer of semiconductor material and the carrier substrate. This is of particular advantage if the layer of semiconductor material is in silicon carbide and if the substrate is in silicon.

For this purpose, a carrier substrate (target) may be used having a superficial insulator layer and the first substrate may be transferred with the layer of semiconductor material onto the insulator layer of the carrier substrate.

It also possible, in alternate or supplemental manner, to form an insulator layer on the layer of semiconductor material before ion implantation step b).

The insulator layer of the carrier substrate and/or the insulator layer formed on the layer of semiconductor material may for example be an oxide layer.

At the end of the process, that is to say after step e), it is possible to increase the thickness of the layer of semiconductor material by homoepitaxy.

In one particular embodiment of the process, for the formation of substrates intended for optoelectronics, a superficial layer in silicon carbide can be made on which a layer of gallium nitride can be formed.

The gallium nitride layer may be formed by heteroepitaxy.

Other characteristics and advantages of the invention will become clearer with the following description which refers to the figures of the appended drawings. This description relates to one particular embodiment of the invention and is given solely for non-restrictive, illustrative purposes.

It is to be noted that, for reasons of clarity, the different layers of material of the structures visible in the figures are not shown to scale; the sizes of some parts are strongly exaggerated.

DESCRIPTION OF THE PREFERRED EMBODIMENTS

Figure 1:
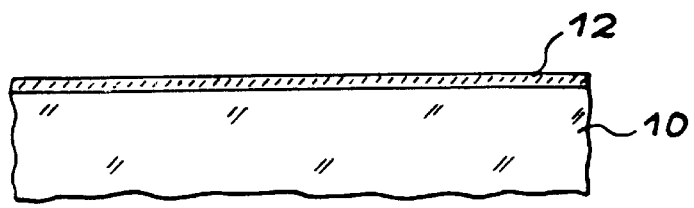
FIGS. 1 to 3 are section views of a first substrate during the preparation stages preceding its transfer onto a carrier substrate or target substrate.

FIG. 1 shows a first substrate 10 in silicon, on which a layer of silicon carbide 12 has been formed.

The layer of silicon carbide is, for example, obtained by surface carburizing the silicon of substrate 10 by reaction between a hydrocarbon and the silicon. This reaction takes place at a temperature in the region of 1350° C. and enables a layer of silicon carbide (SiC) to be formed of narrow thickness. The thickness of the layer of silicon carbide is in the order of 5 to 10 nm.

It can be seen that the process described herein may be used with wafers of large diameter which form the first substrate.

Figure 2:
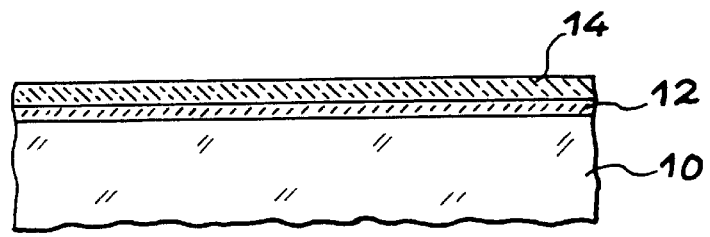

FIG. 2 shows an optional step of the process during which a silicon oxide layer 14 is deposited on the SiC layer 12. The silicon oxide layer whose thickness is in the order of 500 nm enables subsequent reduction of the effects of differential thermal dilatations between the layer of silicon carbide and a carrier substrate in silicon, described below, onto which this layer is transferred.

The thickness of the oxide layer is not critical and may be chosen from a wide range of values.

Figure 3:
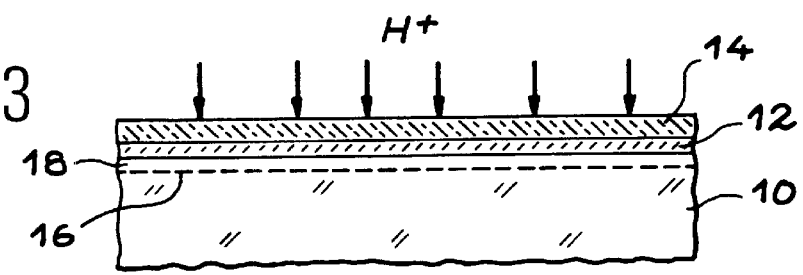

FIG. 3 shows the formation in the first substrate 10 of a cleavage zone 16. The cleavage zone is formed by ion implantation, with hydrogen ions for example. Implantation dose and energy are chosen in relation to the thickness of the SiC layer 12 and oxide layer 14 so as to form the cleavage zone preferably under the superficial layer 12, in substrate 10, as close as possible to its surface, that is to say as close as possible to the Si/SiC interface.

For a more detailed description of the formation of a cleavage zone, reference may be made to document (2) already cited.

The cleavage zone 16 delimits, in silicon substrate 10, a superficial layer of silicon 18.

Figure 4:
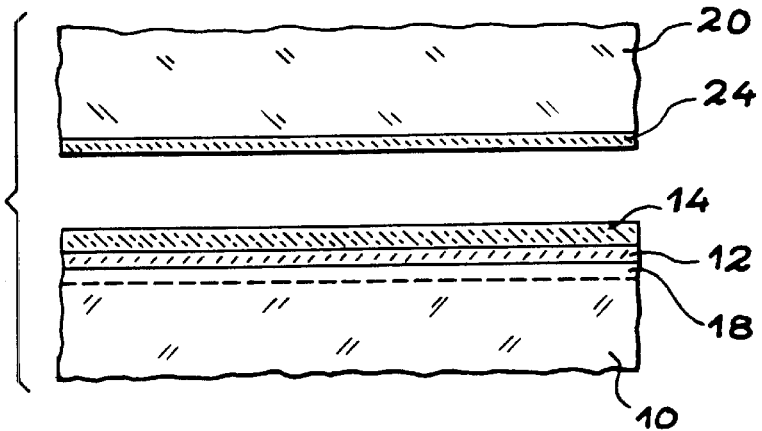
FIGS. 4 and 5 are section views illustrating the transfer operation of the first substrate onto the carrier substrate.

As shown in FIG. 4, the first substrate 10, provided with the layer of silicon carbide 12 and the oxide layer 14, is brought to a second carrier substrate 20, this second substrate is in silicon and on one of its surfaces it has a layer of silicon oxide 24. The carrier substrate 20 is also called a target substrate.

Substrates 10 and 20 are oriented so that the oxide layers 14 and 24, previously cleaned to permit bonding, face one another.

It is to be noted at this point that the oxide later 24 formed on the surface of the second substrate 20, and the oxide layer 14 of the first substrate 16 are optional.

Figure 5:
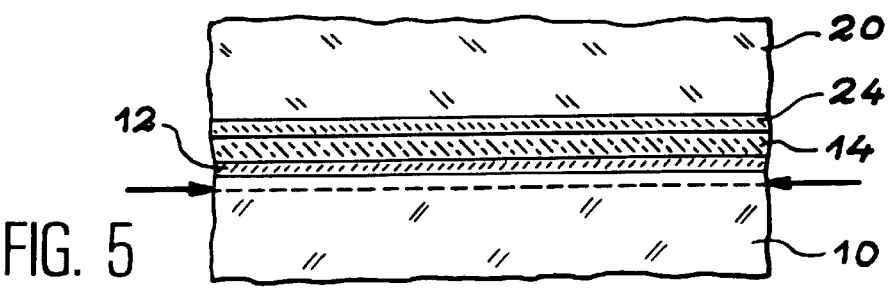

FIG. 5 shows the transfer of the first substrate 10 onto the second substrate 20, by contacting the free surfaces of these substrates, respectively formed by the oxide layers.

The oxide layers are bonded to one another by molecular adhesion. Bonding may be reinforced by appropriate heat treatment.

The heat treatment is continued, or another heat treatment is applied, with a sufficient heat schedule to cause cleavage of the structure in FIG. 5 along the cleavage zone 16. Cleavage is symbolized by arrows.

Figure 6:
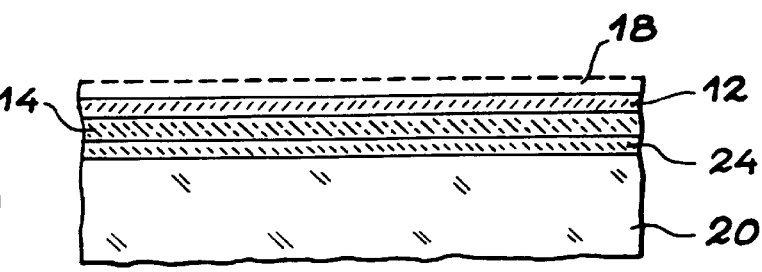
FIG. 6 is a section view of the carrier substrate obtained after cleavage of the first substrate.

After cleavage and after removal of the remaining solid part of the first substrate, the structure shown in FIG. 6 is obtained. The orientation of the second substrate 20 in FIG. 6 has undergone a 180° change relative to FIG. 5.

The structure in FIG. 6 comprises, in this order, carrier substrate 20, oxide layer 24 formed on its surface, oxide layer 14 derived from the first substrate, silicon carbide layer 12 and the thin layer of superficial silicon 18 also derived from the first substrate.

The superficial layer 18 is then removed from the structure, for example by wet chemical attack using a solution of TMAH.

To fabricate sensors or micromechanical parts with a membrane in silicon carbide, the thickness of the silicon carbide layer 12 can be increased by silicon carbide epitaxy on this layer.

Figure 7:
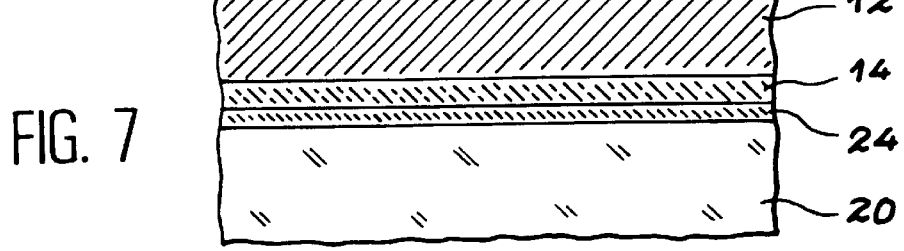
FIG. 7 is a section view of the substrate in FIG. 6 obtained after surface treatment and on which a superficial layer of semiconductor material has been made thicker.

This operation is shown in FIG. 7 in which the thickness of the SiC layer 12 is increased.

With epitaxy it is possible to increase the thickness of the silicon carbide layer up to values of 500 nm to 1 $\mu$m for example.

Structures with suspended SiC membrane can be easily obtained by partial etching of the underlying oxide layers 24, 14.

In another application of the substrate, for example in the area of optoelectronics, a semiconductor material may be formed by heteroepitaxy on SiC layer 12 after removing the superficial layer of silicon.

Figure 8:
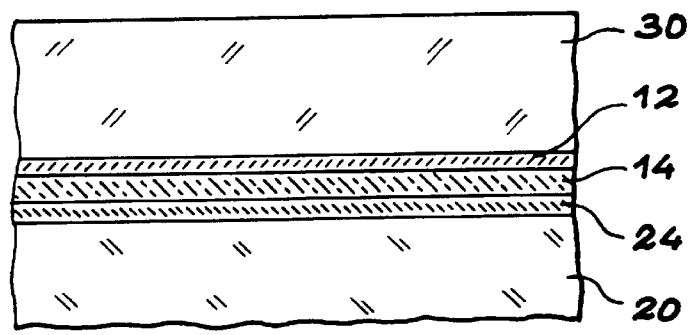
FIG. 8 is a section view of the substrate in FIG. 6 after surface treatment and on which a layer of semiconductor material has been grown.

FIG. 8 shows such application in which a layer of GaN 30 is formed on the uncovered silicone carbide layer 12.

The preceding description only forms a particular example of embodiment of the invention. The materials chosen and the thickness of the layers may vary over a large range in relation to intended applications.

The process of the invention may be applied to materials other than SiC, such as for example AsGa, GaN or ferroelectric material.

It then also allows layers of material of good quality to be obtained, that are little sensitive to thermal dilatations and whose thickness may be adjusted at the end of the process, by epitaxy for example.

Also, the materials used for the first and second substrates may be other than silicon. Sapphire for example may be used.

CITED DOCUMENTS (1) "Smart Cut" Process offers SiC structures on Silicon Wafers, Brian Dance, 58/Semiconductor International, May 1997

(2) EP-A-0 533 551

What is claimed is:

1. A process for fabricating a structure comprising a carrier substrate and a layer of semiconductor material on one surface of the carrier substrate, the process comprising the following successive steps:
  a) forming a layer of semiconductor material on one surface of a first substrate;
  b) implanting ions in the first substrate under said one surface in the vicinity of the layer of semiconductor material to form a cleavage zone which delimits a superficial layer in the first substrate in contact with the layer of semiconductor material;
  c) transferring the first substrate with the layer of semiconductor material onto the carrier substrate while leaving the superficial layer in contact with the layer of semiconductor material, the layer of semiconductor material being made integral with the carrier substrate;
  d) providing energy to cause cleavage of the first substrate along the cleavage zone, the superficial layer of the first substrate remaining integral with the layer of semiconductor material and the carrier substrate during the cleavage; and
  e) removing said superficial layer left over the layer of semiconductor material to uncover the layer of semiconductor material.

2. A process according to claim 1, wherein the step d) comprises supplying the energy in a form of at least one of thermal energy and mechanical energy.

3. A process according to claim 1, wherein the step e) comprises at least one of wet chemical etching, dry chemical etching, polishing, and oxidation followed by etching.

4. A process according to claim 1, wherein the first substrate is a silicon substrate and the layer of semiconductor material is a layer of silicon carbide.

5. A process according to claim 4, wherein the layer of silicon carbide is obtained by causing the silicon substrate to react with a hydrocarbon.

6. A process according to claim 1, further comprising forming an insulator layer on the layer of semiconductor material before the step b).

7. A process according to claim 1, wherein:
the carrier substrate has a superficial insulator layer; and
the step c) comprises transferring the first substrate with the layer of semiconductor material onto the superficial insulator layer of the carrier substrate.

8. A process according to claim 7, wherein the superficial insulator layer is an oxide.

9. A process according to claim 1, further comprising forming epitaxial growth of the same semiconductor material on the layer of semiconductor material after the step e) in order to increase the thickness of the layer of semiconductor material.

10. A process according to claim 4, further comprising forming a layer of GaN on the layer of silicon carbide after the step e).

11. A process according to claim 1, wherein the layer of semiconductor material is made integral with the carrier substrate by heat treatment.

12. A process according to claim 11, wherein said heat treatment, to render the layer of semiconductor material integral with the carrier substrate, is extended to additionally cause the cleavage of the step d).

13. A process according to claim 6, wherein the insulator layer is an oxide.

* * * * *